(12) United States Patent
Franz et al.

(10) Patent No.: US 6,312,264 B1
(45) Date of Patent: Nov. 6, 2001

(54) CONNECTING DEVICE

(75) Inventors: Jochen Franz, Reutlingen; Peter Rühle, Weinstadt-Schnait; Jürgen Böck, Ostfildern, all of (DE)

(73) Assignee: Festo AG & Co., Esslingen (DE)

( * ) Notice: Subject to any disclaimer, the term of this patent is extended or adjusted under 35 U.S.C. 154(b) by 0 days.

(21) Appl. No.: 09/300,872

(22) Filed: Apr. 28, 1999

(30) Foreign Application Priority Data

May 5, 1998 (DE) .......................................... 298 08 048 U

(51) Int. Cl.[7] .............................. H01R 12/00; H05K 1/00
(52) U.S. Cl. ...................... 439/76.1; 439/931; 439/951
(58) Field of Search ................................ 439/76.1, 931, 439/929, 55

(56) References Cited

U.S. PATENT DOCUMENTS

| | | | | |
|---|---|---|---|---|
| 2,524,939 | * | 10/1950 | Stephan et al. ........................... | 439/58 |
| 2,926,340 | * | 2/1960 | Blain et al. ............................... | 365/55 |
| 3,112,145 | * | 11/1963 | Swengel .................................. | 439/55 |
| 3,216,580 | * | 11/1965 | Fricker, Jr. .......................... | 211/41.17 |
| 4,138,179 | * | 2/1979 | Miller et al. ............................. | 439/63 |
| 4,695,112 | * | 9/1987 | Matson et al. ......................... | 439/350 |
| 5,110,298 | | 5/1992 | Dorinski et al. . | |
| 5,641,291 | * | 6/1997 | Sueki et al. .............................. | 439/83 |
| 5,759,069 | * | 6/1998 | Kitatani et al. ....................... | 439/675 |
| 6,123,550 | * | 9/2000 | Burkert et al. .......................... | 439/63 |

FOREIGN PATENT DOCUMENTS

| | | |
|---|---|---|
| 43 28 426 A1 | 3/1994 | (DE) . |
| 296 21 580 U1 | 4/1997 | (DE) . |
| 196 51 800 A1 | 6/1998 | (DE) . |
| 197 01 034 A1 | 8/1998 | (DE) . |
| 4-277474 | 10/1992 | (JP) . |
| 5-315721 | 11/1993 | (JP) . |

* cited by examiner

*Primary Examiner*—Tulsidas Patel
*Assistant Examiner*—Brian S. Webb
(74) *Attorney, Agent, or Firm*—Hoffmann & Baron, LLP

(57) ABSTRACT

A connecting device for the electrical connection of a support board to another component is proposed. The support board has a recess open toward its end and delimited to the side by spring arms, contact faces for the electrical connection being arranged thereon.

17 Claims, 2 Drawing Sheets

CONNECTING DEVICE

FIELD OF THE INVENTION

The invention relates to a connecting device comprising a support board, adapted for supporting electrical components and/or electrical conductors, manufactured of non-conductive material and having contact means serving for producing an electrical connection with mating contact means of another electrical component, said support board having a recess open toward one end thereof, side walls delimiting the recess on opposite sides respectively having an electrically conductive contact face of the contact means, which during the existence of such electrical connection is thrust against a mating contact face, fitting into the recess, of the mating contact means.

DESCRIPTION OF THE PRIOR ART

Such a connecting means is disclosed in the German patent publication (utility model) 29,621,580 U1. It is utilized therein for the transmission of electrical energy, more particularly in the form of high frequency signals. However the design thereof would in principle also appear applicable for one use falling within the field of activities of the assignee, in the case of which for example an electrical connection must be produced between an electromagnet, which has the mating contact means, and a drive circuit for driving or, respectively, controlling the electromagnet. The component, which is to be connected electrically with the support board, in the present case the electromagnet, is frequently gotten from a vendor firm so that difficulties with contacts may occur owing to a summation of inaccuracies. Such inaccuracies in the mating contact means may not be easily allowed for by a suitable adaptation of the contact means on the support board because this would represent substantial added complexity of manufacture and high costs.

SUMMARY OF THE INVENTION

One object of the invention is consequently to create a connecting device in the case of which the contact means on the support board ensure a satisfactory electrical connection even despite possible inaccuracy of the mating contact means.

In order to achieve these and/or other objects appearing from the present specification, claims and drawings, in the present invention the contact faces are respectively provided on a spring arm, able to be moved elastically in a transverse direction thereof, of the support board in such a manner that the two spring arms are urged apart by the mating contact means, fitted into the recess, against a return force and act on the mating contact means in the manner of a tongs.

Owing to the spring arms which are resiliently elastic in the transverse direction, inaccuracies in the mating contact means can be compensated for through a relatively wide range so that even in the case of major inaccuracies a satisfactory mechanical and electrical connection is ensured between the contact means and the mating contact means. Furthermore the danger of plastic deformation of the mating contact means is extremely small. Since the gripping force is produced by the return force of the spring arms, no special requirements must be met as regards the production of the mechanical connection, this in turn meaning that the connecting device renders possible use with differently designed mating contact means.

Advantageous further developments of the invention will appear from the claims.

It is convenient for the contact faces of the contact means for the production of two separate electrical connections to be provided with two separate contact elements. For instance, it is possible for the contact faces of the contact means to serve for producing a two-pole electrical connection with the mating contact faces of the mating contact means. It is in this manner that the two electrical connections, which are produced between a respective contact face and the mating, associated contact face, may be placed at two different electrical potentials.

It is an advantage for the contact faces to he provided functionally adjacent to the free outer ends of the spring arms. It is here that the resiliently elastic mobility of the spring arms in the transverse direction is at its greatest with the result that a satisfactory electrical contact may be ensured between the contact faces and the mating contact faces.

It is also convenient for the contact faces to be constituted by electrically conductive material applied to the side walls of the recess in the support board. In this respect any printed wiring applied to the support board may be connected in a simple manner with the contact face, the contact face simultaneously constituting a sort of through the board contact means so that there is the possibility of connecting any printed wiring provided on both sides of the support board in a simple manner with the contact faces.

The two contact faces may furthermore be component parts of two separate conductive layers, which at least partially cover the inner face of the recess. More particularly, the electrical connection can be between at least one component and/or conductor provided on the support board and at least one of the contact faces via the respective conductive layer. It is in this manner that the connection may be ensured at any desired point on the conductive layer so that the position of the component or, respectively, the course of the conductor on the support board may be selected quite freely.

It is furthermore convenient, in a case in which a lug extends from the base side of the recess toward the open side, opposite thereto, of the recess, such lug together with the spring arms, delimiting two engagement zones of the recess, into which, once the electrical connection has been produced, respectively one contact element, having mating contact faces, of the mating contact means may fit. When the electrical connection exists the lug fills up the free space between the two contact elements at least partly and may present an additional face on the two support faces of the support board for the arrangement thereon of components and/or conductors, as for instance printed wiring.

In the case of a further advantageous embodiment a housing is present, on which the support board may be more particularly detachably mounted. In this respect it is possible for the housing to possess an attachment section serving for the attachment of the component having the mating contact means, the mating contact means fitting through at least one associated housing opening into a connection zone of the housing, in which when the support board is applied to the housing the contact means of the board are located. Accordingly positioning of the support board and of the component having the mating contact means is possible using the housing, same ensuring both a secure mechanical connection, and also a secure electrical connection between the contact means and the mating contact means.

In this respect it is an advantage if support projections are provided on the housing opposite to the respective spring arm inside the recess and at a distance, such projections serving for lateral support of the mating contact means acted upon by a spring arm when the connection is produced.

In the case of design it is possible to provide two openings in the housing for each contact element of the mating contact means, the support projections extending from one respective edge zone of one of the housing openings into the connection zone, and, when the support board is fixed to the housing, at a distance from the associated spring arm into the recess in the support board so that they respectively support the contact element, which after making the electrical connection is between the support projection and the associated spring arm, against the return force of the spring arm. Owing to this measure any accidental deformation of the contact elements is prevented even more reliably.

Further advantageous developments and convenient forms of the invention will be understood from the following detailed descriptive disclosure of one embodiment thereof in conjunction with the accompanying drawings.

BRIEF DESCRIPTION OF THE DRAWINGS

Other objects and many attendant features of this invention will be readily appreciated as the invention becomes better understood by reference to the following detailed description when considered in connection with the accompanying drawings wherein.

DETAILED DESCRIPTION OF THE PREFERRED EMBODIMENTS

Figure 1:
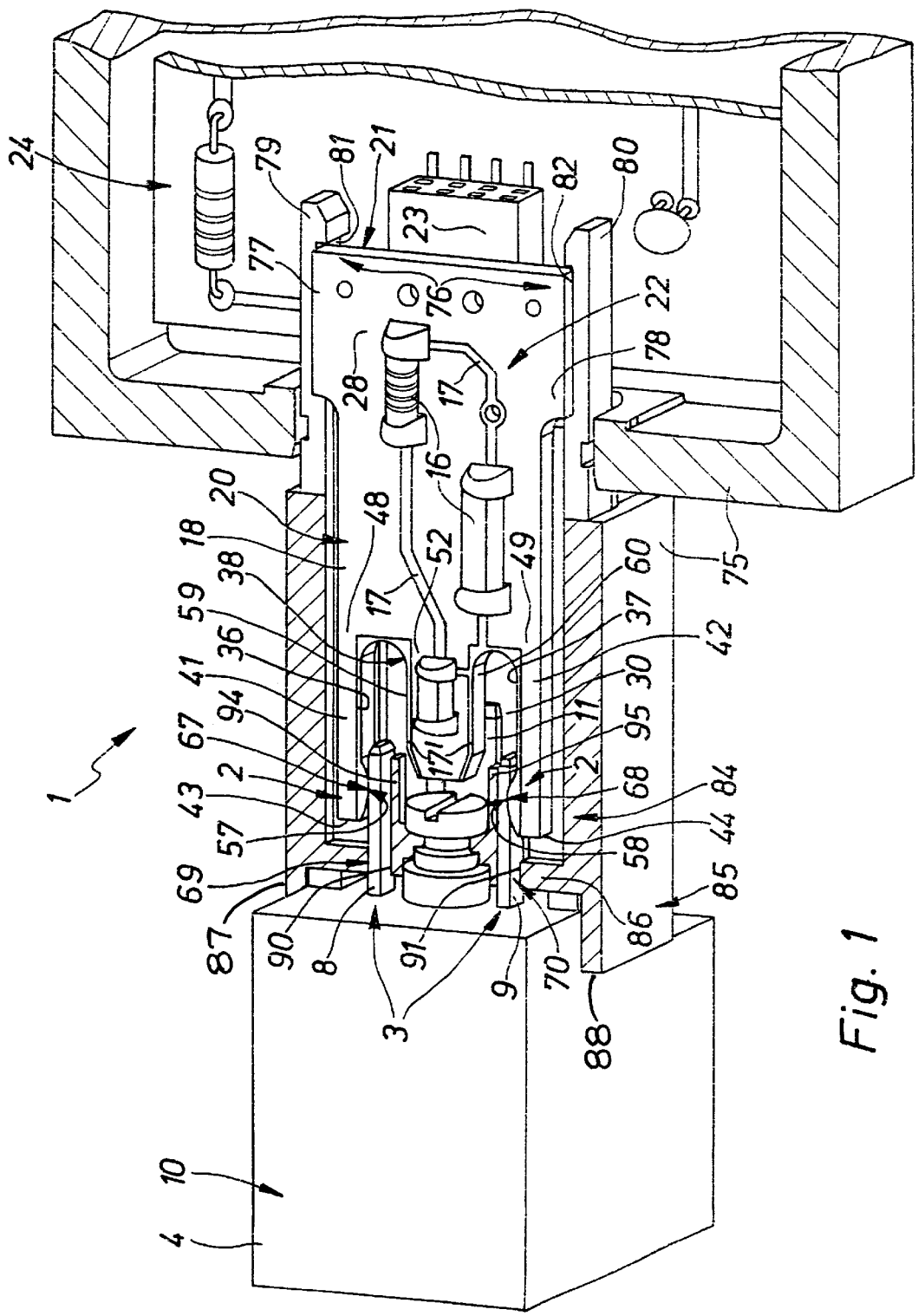
FIG. 1 shows a working embodiment of connecting device in accordance with the invention in a partly sectioned oblique elevation, an electrical connection having been produced between the contact means on the support board and the mating contact means of a separate component.

In FIG. 1 the reader will see a connecting device 1, which serves for the production of an electrical connection. For this purpose the connecting device 1 possesses electrically conductive contact means 2, which for the production of the electrical connection are able to be brought in contact with mating contact means 3, also electrically conductive, of a separate component 4.

The separate component 4 is in the example constituted by an electromagnet of an electromagnetic or solenoid valve, not illustrated in detail, such valve being able to be connected with the electromagnet. It will be clear that alternatively to the working embodiment as illustrated the component 4 might be in the form of any other desired type of electrical component. In the case of such a component it is not necessarily a question of only a single electrical component and in fact it could be a question of any other electrical or electronic circuit arrangement.

The mating contact means 3 of the electromagnet 4 are constituted by two separate contact elements 8 and 9 in the working embodiment. These elements 8 and 9 are designed in the form of pins and extend essentially in parallelism to each other transversely away from the housing 10 of the electromagnet 4. The electromagnet 4 may furthermore possess further additional electrical connections, there being a ground connection 11 in the present case.

For mounting electrical components 16 and/or electrical wiring 17 the connecting device comprises a support board 18 of electrically non-conductive material. The support board 18 is in the example designed in the form of a printed circuit board so that the electrical conductors 17 are in the form of printed wiring, which may be connected with pads 19 or connection faces, to which a component 16 may be soldered or be attached in some other electrically conducting manner. The present embodiment of the support board 18 is designed for so-called SMDs 16 (surface mounted devices) and may be fitted on both support sides 20 and 21 with such components 16.

The components 16 and the printed wiring 17 arranged on the support board 18 constitute an electrical or electronic circuit arrangement 22, which represents a drive circuit of the electromagnet 4 or at least a part thereof. The circuit arrangement 22 may be connected electrically with additional circuit parts 24, for example electrical power, via lead plug 23.

Figure 2:
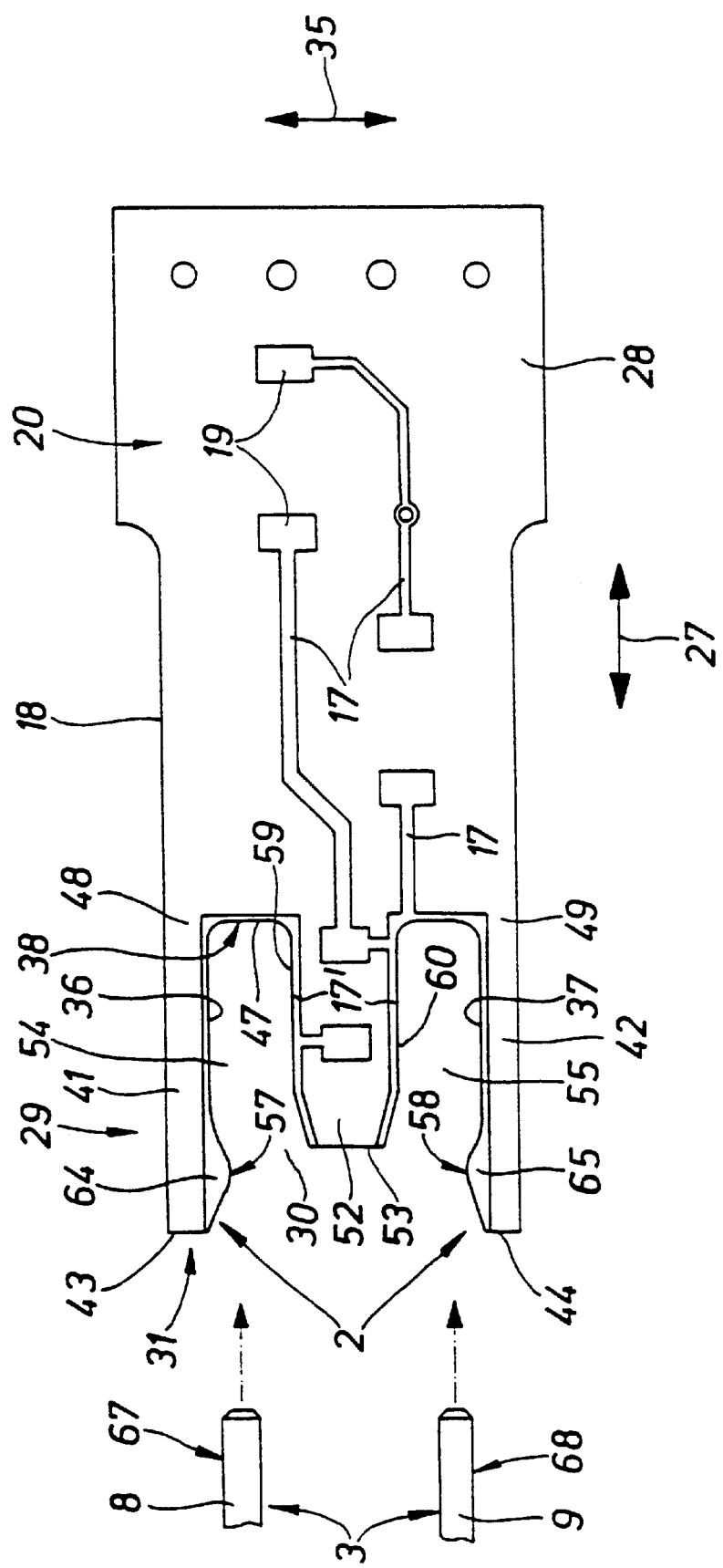
FIG. 2 shows the working embodiment of the support board in accordance with FIG. 1 without a separate component mounted thereon in a plan view athwart the length thereof, mating contact means being indicated diagrammatically.

The support board 18 is as illustrated in FIG. 1 is provided with the circuit arrangement 22 and ready for use, whereas FIG. 2 shows such support board 18, in the form of a printed circuit board 18, bar any components.

In principle the configuration of the support board 18 may be freely selected. In the preferred working embodiment it is of elongated design, an end zone 28, which is the first in the longitudinal direction 27, being widened out athwart the longitudinal direction 27. Both the first end zone 28 and also the remaining zone of the support board are essentially rectangular.

In the second end zone 29, opposite to the first end zone 28 in the longitudinal direction 27 of the support board, a recess 30 is provided, which is open toward one end 31 of the support board 18. In the present case the recess 30 is open toward the end 31, which is turned in the longitudinal direction 27, of the second end zone 29.

In the transverse direction 35 the recess 30 is delimited by two longitudinally extending side walls 36 and 37, which are opposite each other at a distance and respectively constitute a section of the inner face 38 of the recess 30. The side walls 36 and 37 extend at least partly (and in the example completely) on a spring arm 41. and 42 able to be moved resiliently in the transverse direction 35, of the support board 18. These spring arms 41 and 42 extend on each side of the recess 30 in the longitudinal direction 27 and are essentially constituted by the material left after the production of the recess, of the support board. Between the two free ends 43 and 44 of the spring arms 41 and 42 the open side of the recess 30 is to be found.

Functionally at the base side 47, opposite to the open side, of the recess 30 the spring arms 41 and 42 are able to be elastically pivoted by means of their inner ends 48 and 49 opposite their respective outer free ends 43 and 44. The elasticity of the spring arms 41 and 42 is due to the fact that their thickness in the transverse direction 35 is suitably reduced. The result of this is that points at a greater distance from the inner end 48 and 49 are able to be deflected a greater distance in the transverse direction than points which are nearer the inner end 48 and 49 of the respective spring arm 41 and 42.

Generally speaking the second end zone, having the recess 30 and the spring arms 41 and 42, of the support board 18 is shaped like a tongs.

A lug 52 extends from the base side 47 of the recess 30 in the longitudinal direction 27 toward the open side of the recess 30. Its length is preferably less than that of the two spring arms 41 and 42 with the result that its free end 53 is within the recess 30. Together with the spring arms 41 and 42 the lug 52 delimits engagement zones 54 and 55 for the contact elements 8 and 9 of the mating contact means 3, which after the production of the electrical connection between the contact means 2 and the mating contact means 3 may fit into the engagement zones 54 and 55, as will be described in more detail below.

The contact means 2 are provided on the support board 18. They have two electrically conductive contact faces 57 and 58, which are provided on the side walls 36 and 37 of the recess 30. In the preferred working embodiment of the invention the contact faces 57 and 58 are functionally on the open side of the recess 30 on the free outer ends 43 and 44 of the spring arms 41 and 42 and are turned toward each other. In the preferred working embodiment of the support board 18 they are constituted by electrically conductive material applied to the side walls 36 and 37, such material being for example copper, which may in addition be tinned.

In the example the contact faces 57 and 58 constitute components of a separate conductive layer 59 and 60, which almost completely cover the inner face 38 of the recess 30, only the end face of the free end 53 of the lug 52 being free of conductive layer. Consequently essentially a point of separation between the two conductive layers 59 and 60 is provided at the end face, it however being possible for such point of separation to be located in the alternative at some other point on the inner face 38 of the recess 30.

Along their length the two conductive layers 59 and 60 are, in the working example, on both support faces 20 and 21 of the support board 18 connected with printed wiring 17' running around the recess 30 functionally adjacent to the conductive layers 59 and 60. It is possible for the printed wiring 17, which is to be electrically connected with one of the contact faces 57 and 58, to be connected with such surrounding printed wiring 17' at any desired points. This means that it is not necessary to lay printed wiring directly as far as the respective contact face 57 and 58 and in fact the electrical connection may be via the respective conductive layer 59 and 60 or, respectively, the respective marginal printed wiring 17' connected therewith.

In order to produce a satisfactory contact between the contact means 2 and the mating contact means 3, the contact faces 57 and 58 of the contact means 2 are respectively provided with a contact projection 64 and 65 which extends into the recess 30, of the respective spring arm 41 and 42. The contact projections 64 and 65 possess a rounded, outwardly bent configuration, the contact faces 57 and 58 being located functionally at the point projecting furthest into the recess 30, of the respective contact projection 64 and 65.

The mating contact means 3 have mating contact faces 67 and 68, which when the electrical connection is made, come into contact with the contact faces 57 and 58 of the contact means 2. In the illustrated working embodiment, the mating contact faces 67 and 68 are provided on the outer side 69 and 70 of contact elements 8 and 9 facing away from the other contact element 8 and, respectively, 9. When the electrical connection is produced—for instance by plugging together the contact means 2 and the mating contact means 3—the mating contact faces 67 and 68 are aligned in the transverse direction 35 and face in opposite directions. The contact elements 8 and 9 have their respective mating contact face 67 and 68 in the recess 30 in the support board 18. At this stage, the spring arms 41 and 42 are spread apart elastically in the transverse direction to some extent with the result that a return or biasing force of the spring arms 41 and 42 takes effect tending to thrust the contact faces 57 and 58 from the outside against the respectively associated mating contact face 67 and 68 of the contact elements 8 and 9 in a tongs-like fashion. This means that a satisfactory electrical connection is produced between the contact faces 57 and 58 and the respective mating contact face 67 and 68.

The contact elements 8 and 9 of the mating contact means 3 are only acted upon from one side by the associated spring arms 41 and 42.

The contact faces 57 and 58 are made electrically separate, that is to say they may during use of the connecting device 1 be placed at different electrical potentials. The result of this is that by means of the two contact faces 57 and 58 two separate electrical connections may be produced so that the two pairs of contact faces and associated mating contact faces 57 and 67 and, respectively, 58 and 68, respectively represent one pole of the electrical connection between the contact means 2 and the mating contact means 3. Each contact face 57 and 58 of the contact means 2 accordingly serves for the production of one pole of the electrical connection.

As shown in FIG. 1, the connecting device 1 preferably possesses a housing 75, on which the support board 18 may be detachably fitted, for which purpose a detent connection 76 is more particularly provided.

In the working example the support board 18 possesses two detent projections 77 and 78, which are constituted by a respective portion widening out the first end zone 28 of the support board 18 in the transverse direction 35 thereof. For these detent projections 77 and 78 there are detent recesses 81 and 82 on resiliently elastic, movable detent arms 79 and 80 of the housing 75, into which recesses 81 and 82 the detent projections 77 and 78 fit when the detent connection is made, the detent arms 79 and 80 moving elastically out of the way when the detent connection is made. It will be clear that the arrangement of the parts as illustrated in the figure may be mechanically reversed so that the detent projections 77 and 78 may also be arranged on the housing 75 and the detent recesses 81 and 82 may be arranged on the support board 18 accordingly. Furthermore any other desired modification of the detent connection means 76 is possible. In principle instead of the detent connection means 76 any other means for producing a detachable connection between the support board 18 and the housing 75 could be employed.

When the support board 18 is arranged on the housing 75, the contact means 2 are in a connection zone 84 of the housing 75. Adjacent to the connection zone 84, the housing 75 possesses an attachment section 85 serving for the attachment of the component 4 constituted by the electromagnet. In the example, the attachment section 85 and the connection zone 84 are separated from one another by a transversely extending partition 86 of the housing 75, it being possible to omit such partition as well as a modification of the working example illustrated.

The electromagnet 4 and, respectively, its housing 10 is able to be so arranged on the attachment section 85 that the mating contact means 3 are located in a position rendering possible an electrical connection with the contact means 2. For this purpose, two wall portions 87 and 88 fit around the housing 10 of the electromagnet 4 on at least two opposite sides so that centering or positioning of the electromagnet 4 in relation to the housing 75 of the connecting device 1 is possible. For the attachment of the electromagnet 4 on the housing 75, it is possible for instance to utilize a screw connection, an opening being present in the partition 86 for this purpose as illustrated in FIG. 1.

In the partition 86 there are furthermore two housing openings 90 and 91, which are provided for the contact elements 8 and 9 of the mating contact means 3 and in the position of use render possible the movement of the contact elements 8 and 9 away from the attachment section 85 into the connection zone 84.

For supporting the contact elements 8 and 9 of the mating contact means 3 in the transverse direction 35, the housing 75 possesses support projections 94 and 95, which are respectively associated with each spring arm 41 and 42. They are placed at a distance from this spring arm 41 and, respectively, 42 and, when the support board 18 is arranged on the housing 75, they fit into its recess 30.

In the illustrated working embodiment the support projections 94 and 95 are provided on the partition 86 as an extension of the marginal zone of a respective housing opening 90 and 91 on facing sides and from the partition 86 extend into the connection zone 84. The support projections 94 and 95 are in the example so arranged that their outer free end section projects in an engagement zone 54 and 55 of the recess 30 and extend substantially parallel to the direction of the spring arms 41 and 42. In this respect they are set at a distance from the respectively associated spring arm 41 and 42. The respective contact element 8 and 9 of the mating contact means 3 fits into the intermediate space so produced when the connection is made and plugged together, it having its mating contact face 67 and 68 resting on the one side on the associated contact face 57 and 58 of the spring arm 41 and 42 and being supported from the opposite side by the adjacent support projection 94 and 95.

Once both the support board 18 and also the electromagnet 4 are arranged on the housing 75 of the connecting device 1, the support projections 94 and 95 will resist the return force produced by the spreading apart of the spring arms 41 and 42 and will prevent any deformation of the contact elements 8 and 9.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A connecting device comprising a planar support board, adapted for supporting electrical components and/or electrical conductors, manufactured of non-conductive material and having a contact serving for producing an electrical connection with a mating contact of another electrical component, said planar support board having a planar recess open toward one end thereof, side walls delimiting the planar recess on opposite sides respectively having electrically conductive contact faces of the contact, which during the existence of such electrical connection is thrust against a mating contact face of the mating contact that is fitted into the planar recess wherein the contact faces of the contact are respectively provided on spring arms, the spring arms operating cooperatively and being elastically movable in an outward transverse direction of the planar support board in such a manner that the spring arms are urged apart by the mating contact when the mating contact is fitted into the planar recess of the planar support board, against a biasing force provided by the spring arms.

2. The connecting device as set forth in claim 1, wherein the contact faces of the contact are adapted to produce two separate electrical connections with two separate contact elements of the mating contact.

3. The connecting device as set forth in claim 1, wherein the contact faces of the contact are adapted for producing a two-pole electrical connection with the mating contact faces of the mating contact.

4. The connecting device as set forth in claim 1, wherein the contact faces are provided functionally at free outer ends of the spring arms.

5. The connecting device as set forth in claim 1, wherein the contact faces are provided respectively on contact projections extending to the side of the respective spring arm within the recess of the support board.

6. The connecting device as set forth in claim 1, wherein the contact faces include electrically conductive material applied to the side walls of the recess of the support board.

7. The connecting device as set forth in claim 1, wherein the two contact faces are components of two separate conductive layers, which at least in part cover the inner face of the recess.

8. The connecting device as set forth in claim 7, wherein the electrical connection between at least one component and/or conductor provided on the support board and at least one of the contact faces is via the respective conductive layer.

9. The connecting device as set forth in claim 1, comprising a lug extending from the base side of the recess toward the open side of the recess opposite to same, the lug cooperating with the spring arms in delimiting two engagement zones of the recess, wherein a respective contact element corresponding to one of the mating contact faces of the mating contact engages the contact in the respective engagement zone to provide electrical connection.

10. The connecting device as set forth in claim 9, wherein the two contact faces are components of two separate conductive layers, which at least partially cover the inner face of the recess, and wherein the inner face of the recess is covered with a conductive layer apart from the end face of the lug disposed toward the open side.

11. The connecting device as set forth in claim 1, wherein the support board is in the form of a printed circuit board.

12. The connecting device as set forth in claim 1, comprising a housing in which the support board is mounted in a detachable manner.

13. The connecting device as set forth in claim 12, comprising a detent connecting means for detachably connecting the support board and the housing together.

14. The connecting device as set forth in claim 13, wherein said detent connecting means comprises at least one detent projection provided on the support board, such detent projection comprising a section widening the support board athwart the length direction of the spring arms, such section being located in the end zone opposite to the spring arms, of the support board.

15. A connecting device comprising a housing and a support board detachably mounted to said housing, adapted for supporting electrical components and/or electrical conductors, manufactured of non-conductive material and having a contact for providing an electrical connection with a mating contact of another electrical component, said support board having a recess open toward one end thereof, side walls delimiting the recess on opposite sides respectively and having electrically conductive contact faces of the contact, which during the existence of such electrical connection is thrust against a mating contact face of the mating contact that is fitted into the recess, wherein the contact faces are respectively provided on spring arms, the spring arms being elastically movable in a transverse direction of the support board in such a manner that the spring arms are urged apart by the mating contact when the mating contact is fitted into the recess of the support board, against a biasing force provided by the spring arms, and wherein the housing comprises an attachment section for attachment of the component, a connection zone and at least one housing opening, whereby the mating contact of the component extends through at least one housing opening into the connection zone of the housing when the support board is electrically connected to the component.

16. A connecting device comprising a housing and a support board detachably mounted to said housing, adapted for supporting electrical components and/or electrical conductors, manufactured of non-conductive material and having a contact for providing an electrical connection with a mating contact of another electrical component, said support board having a recess open toward one end thereof, side walls delimiting the recess on opposite sides respectively and having electrically conductive contact faces of the contact, which during the existence of such electrical connection is thrust against a mating contact face of the mating contact that is fitted into the recess, wherein the contact faces are respectively provided on spring arms, the spring arms being elastically movable in a transverse direction of the support board in such a manner that the spring arms are urged apart by the mating contact when the mating contact is fitted into the recess of the support board, against a biasing force provided by the spring arms, and wherein the housing comprises support projections located opposite each spring arm within the recess of the support board, and whereby the support projections provide lateral support to the mating contact of the component when the support board is electrically connected to the component.

17. The connecting device as set forth in claim 16, wherein the mating contact comprises two contact elements and the housing further comprises a connection zone and two openings for receiving the respective contact elements, wherein the support projections extend from a respective marginal zone of one of the housing openings into the connection zone so that when the support board is electrically connected to the component, the support projections are located in the recess of the support board at a distance from the associated spring arm, the spring arm bearing against the contact element located respectively between the support projection of the housing and the associated spring arm of the support board.

* * * * *